US005420757A

United States Patent [19]

Eberhardt et al.

[11] Patent Number: 5,420,757
[45] Date of Patent: May 30, 1995

[54] METHOD OF PRODUCING A RADIO FREQUENCY TRANSPONDER WITH A MOLDED ENVIRONMENTALLY SEALED PACKAGE

[75] Inventors: Noel H. Eberhardt, Cupertino; Jean-Marc Delbecq, Santa Clara, both of Calif.

[73] Assignee: Indala Corporation, San Jose, Calif.

[21] Appl. No.: 158,922

[22] Filed: Jun. 11, 1993

Related U.S. Application Data

[63] Continuation of Ser. No. 15,200, Feb. 11, 1993, abandoned.

[51] Int. Cl.6 .............................................. H05K 1/02
[52] U.S. Cl. ................................. 361/813; 174/52.2; 174/52.4; 29/827; 361/728
[58] Field of Search ..................... 174/52.2, 52.4; 361/728, 767, 813; 29/827, 841, 855, 856

[56] References Cited

U.S. PATENT DOCUMENTS

| 3,627,901 | 12/1971 | Happ | 174/52 PE |
|---|---|---|---|
| 4,028,722 | 6/1977 | Helda | 357/70 |
| 4,289,922 | 9/1981 | Devlin | 174/52 FP |
| 4,628,148 | 12/1986 | Endou | 17/52 PE |
| 4,756,080 | 7/1988 | Thorp, Jr. et al. | 29/827 |
| 5,025,114 | 6/1991 | Braden | 174/52.4 |
| 5,266,739 | 11/1993 | Yamauchi | 174/52.2 |
| 5,283,717 | 2/1994 | Hundt | 361/813 |

Primary Examiner—Leo P. Picard
Assistant Examiner—L. Thomas
Attorney, Agent, or Firm—Spencer, Frank & Schneider

[57] ABSTRACT

A method of forming an environmentally sealed transponder type circuit wherein the circuit components are mounted on a lead type substrate frame, the components are encapsulated in a plastic housing in a plastic molding process so that the housing is supported in the frame only by a plurality of the leads, and then severing the leads at the periphery of the housing to provide a leadless package. The frame may be formed of a conductive material, an insulating material or as a printed circuit board. A novel printed circuit type lead frame whereby a coil of the circuit may be mechanically attached and directly secured to the frame is additionally disclosed.

21 Claims, 6 Drawing Sheets

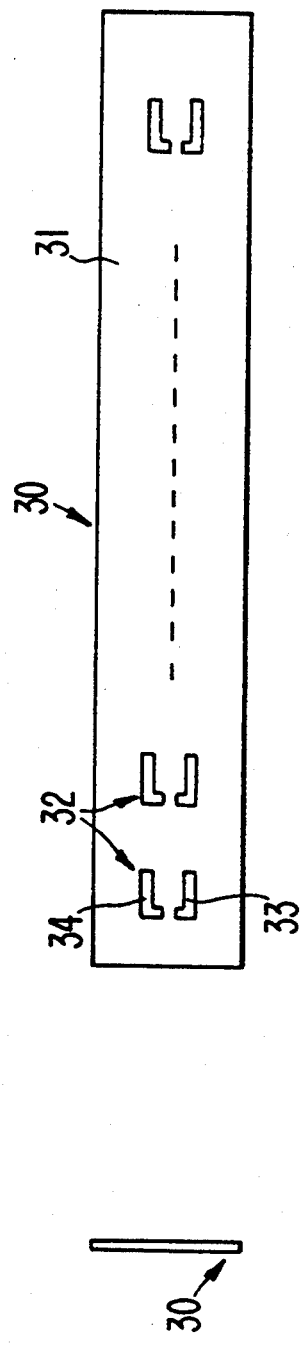
FIG. 2
FIG. 2a
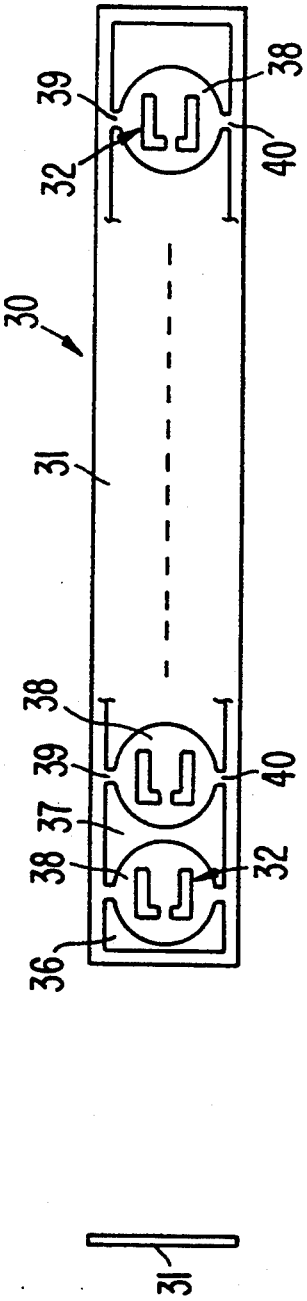
FIG. 3
FIG. 3a

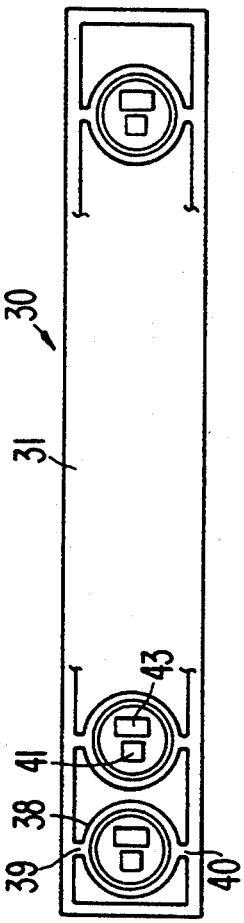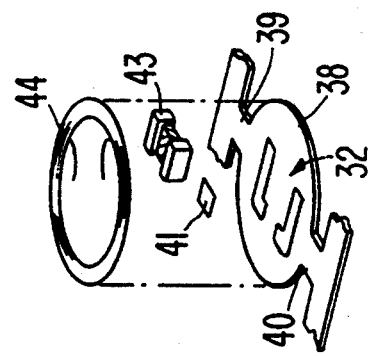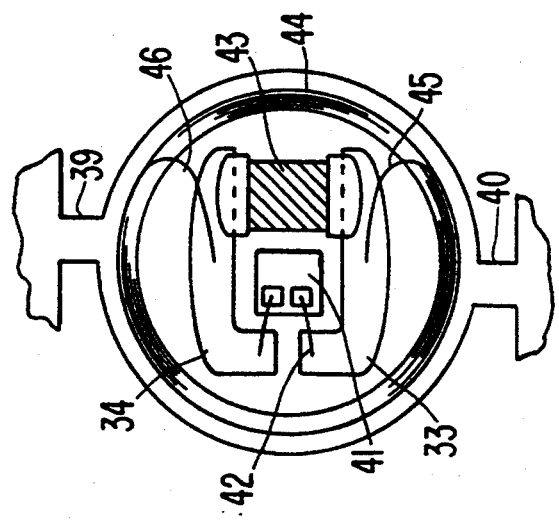

METHOD OF PRODUCING A RADIO FREQUENCY TRANSPONDER WITH A MOLDED ENVIRONMENTALLY SEALED PACKAGE

CROSS-REFERENCE TO RELATED APPLICATION

This application is a continuing application of applicants' U.S. patent application Ser. No. 08/015,200 filed Feb. 11th, 1993 abandoned.

BACKGROUND OF THE INVENTION

The present invention relates to radio frequency transponders or tags, and more particularly to a method of assembling and housing such transponders. More specifically, the present invention relates to a method of providing a hermetically sealed package including a radio frequency transponder of the type which generally includes a coil connected to an integrated circuit and which is responsive to a received radio frequency interrogating signal to produce a radio frequency identifying signal. Transponder circuits of this type are well known in the art and, for example are shown in U.S. Pat. No. 5,099,227, issued Mar. 24th, 1992. The present invention also relates to a novel lead frame for use in the method.

Transponders of the type to which the present invention is directed are relatively small in size and are utilized for many applications, for example the access cards used for security systems to permit entry to a protected building, or to identify a particular object to which the transponder or tag is attached. In the past, such transponders were assembled and packaged in a number of different configurations. For example, the transponder electronics including the integrated circuit and the coil (and possibly a capacitor) were sealed in a glass tube, or were potted within an enclosure. A further method was to enclose the transponder electronics in a housing formed of two non-metallic housing parts which were fitted together and then welded and/or glued to form the housing. While all of these housing methods are satisfactory for various applications, the above-mentioned type packages are either unsatisfactory or are too expensive for other applications. For example, one use for such transponder devices is to attach same to articles of clothing or other textile-like materials, for example towels or sheets etc., which are to be cleaned and/or washed so as to facilitate identification of the owner of the particular article after the cleaning or washing process. For such applications, the transponder package must be hermetically sealed relative to water vapor, high temperature and laundering solutions, should be relatively small and preferably flat so as to be unobtrusive when permanently attached to the textile article, must be rugged relative to the laundering process, and should be relatively inexpensive. None of the previously mentioned packages satisfactorily meets these criteria.

Accordingly, it is the object of the present invention to provide an improved method of forming a packaged radio frequency identification device or transponder wherein the package is hermetically or environmentally sealed in a relatively simple manner.

SUMMARY OF THE INVENTION

The above object generally is achieved according to one embodiment of the invention by a method of forming a hermetically sealed radio frequency identification device which comprises the steps of providing a flat carrier or substrate having an opening and a plurality of inwardly directed supporting arms extending into the opening for supporting a radio frequency identification circuit including at least one coil for transmitting or receiving radio frequency energy, and an integrated circuit chip connected to the coil; mounting the circuit on the supporting arms such that the circuit including the coil is completely within the opening; forming an environmentally sealed plastic housing completely around the circuit and coil by encapsulation so that the housing is disposed within the opening and supported in the carrier only by the supporting arms; and severing the supporting arms at the periphery of the housing.

According to features of this embodiment of the method, the carrier or substrate is formed of metal and the mounting step includes electrically connecting at least the coil and the circuit chip of the radio frequency circuit together via at least some of the supporting arms or directly to each other. Alternately, the substrate may be formed of an insulating or non-electrically conductive material whereby the circuit components are electrically connected together prior to or as a result of mounting on the carrier.

According to a preferred embodiment the method of forming a hermetically sealed radio frequency identification device comprises: providing a substrate (printed circuit board) having a flat carrier of an insulating material and a plurality of respective conductor patterns arranged in a pattern on respective spaced device mounting regions of the carrier, with the carrier having openings such that each of the respective mounting regions includes a respective central portion which contains the respective conductor pattern and which is connected to the remainder of the carrier only by a respective plurality of supporting arms distributed about the periphery of the central portion; mounting a respective circuit chip for a radio frequency identification circuit and at least one coil for transmitting or receiving radio frequency energy on a respective mounting region and connecting same via the respective conductor pattern to form a radio frequency identification circuit; forming a respective environmentally (hermetically) sealed plastic housing completely around the central portion of the respective mounting region and the associated radio frequency identification circuit by encapsulation in plastic, e.g. transfer molding, injection molding or casting, so that the sealed housing is connected to the carrier only via the respective plurality of supporting arms; and severing the supporting arms to remove the housed radio frequency identification circuit device from the carrier.

According to one variation of this embodiment, the coil is a flat coil, the respective central portions of the mounting regions are of a size less than an inner diameter of the coil, and the mounting step includes positioning the coil so that it surrounds the associated central portion and so that the coil is engaged and supported on its one side facing the substrate or printed circuit board by supporting arms. Preferably, the removing step additionally includes forming at least one outwardly directed projection, finger or tab on the periphery of the central portion of the mounting region between at least some of two adjacent supporting arms, and the mounting further includes forming at least some of the respective projections so that they extend through the associated coil and engage same on its side facing away from the substrate to physically secure the coil to the mounting region. Still more preferably, oppositely disposed fingers are formed to provide offsetting oppositely directed yet balanced forces on the coil.

According to a further variation of the preferred method, the coil is a flat coil, the removing includes forming the respective mounting regions to be of a size greater than an outer diameter of the associated coil, and the mounting step includes placing the coil on the central portion so that it surrounds the respective conductor pattern and in turn is surrounded by the central portion.

Finally, according to a further aspect of the invention, a non-conductive frame (substrate) for mounting of a circuit including at least a flat coil and an integrated circuit connected thereto is provided with the frame comprising: a printed substrate having a flat carrier of an electrically non-conductive material and a plurality of respective electrical conductor patterns disposed on one surface of the carrier and arranged in a row on respective spaced circuit component mounting regions of the carrier; a plurality of openings formed in the carrier such that each respective mounting region includes a central portion which completely contains the respective conductive pattern and which is connected to the remainder of the substrate only by a respective plurality of supporting lead-like portions of the substrate distributed about the periphery of said central portion. Preferably, each of the central portions smaller than the inner diameter of the coil to be mounted thereon, and the mounting region further includes at least one outwardly directed finger projecting from the periphery of the respective central portion between each two adjacent supporting lead-like portions, with the fingers being of a length such that they can extend over a coil placed on a surface of the carrier to mechanically secure the coil on the mounting region.

BRIEF DESCRIPTION OF THE DRAWINGS

FIGS. 2 and 2a, 3 and 3a, 4 and 4a, and 5 and 5a are top and side views respectively showing successive method steps according to a second embodiment of the invention wherein a non-conductive carrier with a conductive pattern, i.e. an arrangement similar to a printed circuit board, is used for the substrate or lead frame.

FIG. 4b is an enlarged top view showing the assembly of components on the PC board of FIG. 4, while FIG. 4c is an exploded view showing the respective components used in the assembly of FIG. 4.

FIG. 6 is a plan view showing the severing step for the process of FIGS. 2-5, while

DETAILED DESCRIPTION OF THE PREFERRED EMBODIMENTS

Figure 1:
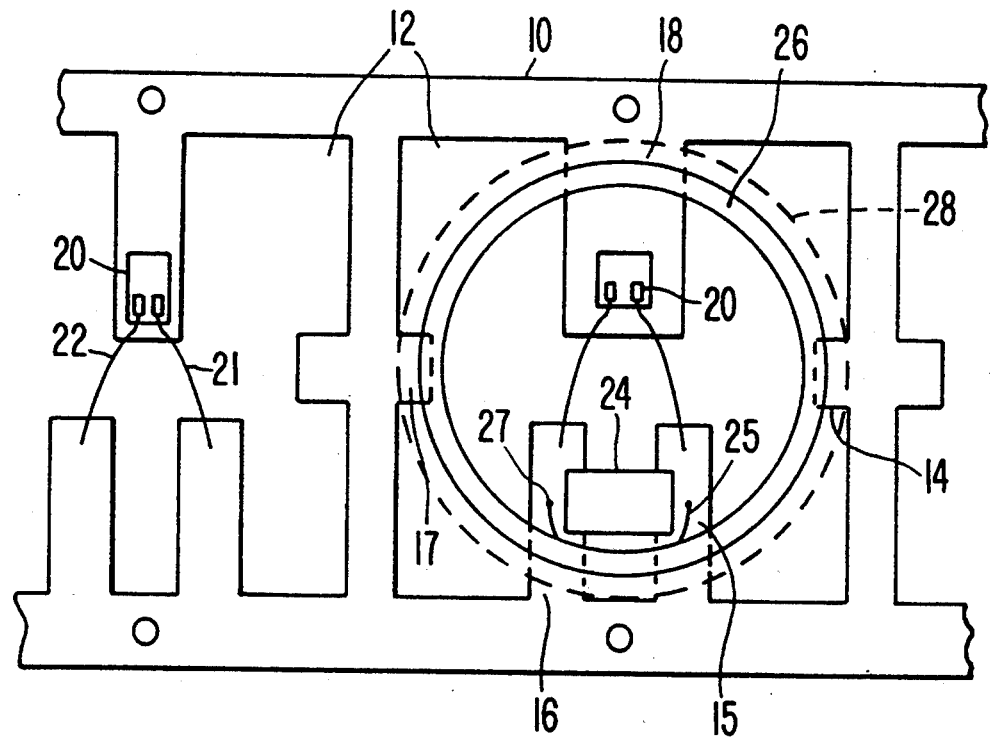
FIG. 1 a plan view showing a lead frame or substrate with the assembled electronics according to a first embodiment of the invention.
Figure 1A:
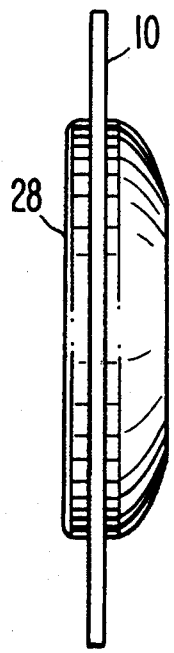
FIG. 1a is a side view showing the encapsulated transponder in the lead frame of FIG. 1.
Figure 1B:
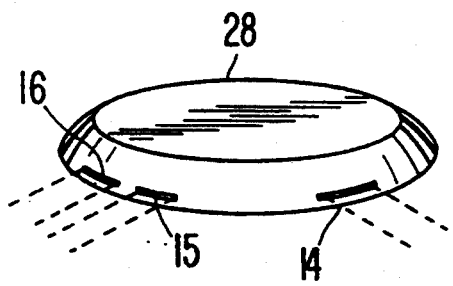
FIG. 1b shows the encapsulated transponder of FIG. 1a after removal/from the lead frame.

Referring now to FIGS. 1, 1a and 1b, according to a first embodiment of the method according to the invention for housing or packaging a radio frequency transponder or tag with a circuit generally including three components, i.e. an integrated circuit having a parallel resonant circuit comprised of a flat coil of insulated wire and a capacitor connected to the input of the integrated circuit. According to this first embodiment of the invention, a metal substrate or lead frame 10 having at least one opening 12, and preferably a plurality of such openings 12 arranged in a row, is provided, for example by etching or stamping a flat thin sheet of metal, for example a sheet of copper. The opening or openings 12 may be rectangular as shown or may be circular if a circular housing or package is to be produced (as is the case according to the preferred embodiment of the invention) so long as the dimensions of the opening are larger than that of the package or housing to ultimately be formed. As is further shown, the etching, stamping or punching to produce the openings 12 is such that a plurality of conductive supporting arms or leads 14–18 extend inwardly into each opening 12, and are distributed about the periphery of the opening. In the illustrated embodiment, and for the three component circuit mentioned above, two of the supporting arms or leads 15 and 16 are disposed parallel to one another and extend in a first direction toward the opposed supporting arm 18 and serve as conductors for connecting the components together as well as to serve as a support for the coil as will be explained below. The other two opposed arms 14 and 17 are shorter than the arms 15, 16 and 18 and will serve only as support arms for the coil.

According to the method of the invention, and with the lead frame configuration shown, the integrated circuit is initially mounted on the lead 18, for example by an adhesive or by soldering, and its input/output terminals are connected via respective leads 21, 22 to the leads 15 and 16 respectively. In the illustrated embodiment, the integrated circuit 20 is not electrically connected to the lead or arm 18 via one of its input/output terminals.

To complete the mounting of the circuit, a capacitor 24 is mounted on and electrically connected to the leads 15 and 16 and a coil 26, which as shown is a flat coil of insulated wire, is placed on top of the leads or arms 14–18 and supported thereby. The coil 26 may be mechanically secured to one or more of the leads or supporting arms 14–18 via an adhesive if desired or by forming the leads such that they hold the coil. However, the two ends 25 and 27 of the coil 26 are electrically connected to leads 15 and 16 respectively. As can be seen from the drawing, the outer dimension of the coil 26 is such that it lies completely within the respective opening 12 and its inner diameter is such that it surrounds the integrated circuit 20 and the capacitor 24, i.e. the integrated circuit and capacitor are disposed within the coil.

Thereafter, the lead frame 10 with the respective circuits components 20, 24 and 26 mounted thereon, is placed in a mold cavity of a plastic encapsulating, e.g., transfer molding, apparatus and a plastic housing of a suitable thermosetting plastic formed around each circuit in a known manner, i.e., by injecting a thermosetting plastic epoxy or thermoplastic material into the mold cavity under pressure and then allowed to harden at an elevated temperature. As shown, the dimensions of the housing 28 which can be seen in FIG. 1b and is indicated by a dashed line in FIG. 1, is such that the housing 28 is entirely within the respective opening 12 and supported in the carrier 10 only by the supporting arms 14-18. Thereafter, each of the arms 14-18 is severed at the periphery of the housing 28 to provide the actual device as shown in FIG. 1b. As can be seen from this figure, with the method disclosed, the hermetically sealed circuit device contains no outwardly extending leads or arms of any type, although the respective supporting arms or leads 14-18 do extend to and can be seen at the periphery of the housing 28 as shown in FIG. 1b.

Although the embodiment of FIG. 1, 1a and 1b has been disclosed using a metal lead frame 10, it is to be understood that a very similar process with a carrier formed entirely of an electrically non-conducting or insulating material can be used. In such case, however, it would be necessary that the three components 20, 24 and 26 be electrically connected together prior to the mounting on the lead frame of non-conductive or insulating material, e.g. glass reinforced epoxy resin. Moreover, with such an arrangement and since the arms serve only for support of the coil and the attached components, and not as conductors, only four orthogonally disposed inwardly directed supporting arms of a length similar to arms 14 and 17 need be provided with a rectangular opening 12 as shown. Alternatively, with a circular opening, only three such supporting arms, preferably symmetrically distributed about the opening, would be required. The remaining steps of the method, i.e., the mounting of the circuit, the forming of the environmentally sealed plastic package by plastic molding or encapsulation, and the severing of the supporting arms at the periphery of the finished housing 28 are essentially the same as that utilized for the metal lead frame of FIG. 1.

Although the method discussed above is satisfactory for many applications, they nevertheless do suffer from a number of disadvantages or problems. For example, although the method utilizing the metal lead frame 10 is simple and relatively inexpensive, the exposed presence of the ends of the supporting arms or leads 14-18 at the periphery of the housing 28 is undesirable for certain uses of the transponder device. For example, when using such a device in a cleaning or washing environment, an undesirable chemical reaction between the cleaning or washing solution and the exposed ends of the supporting lead 14-18 may occur. Although this undesirable problem resulting from using a metal lead frame would be overcome by utilizing a non-metal or insulating frame as further discussed above, this latter process is more expensive. These problems or drawbacks of these embodiments of the method are overcome by the preferred embodiment of the invention utilizing a metalized carrier similar to a printed circuit board as the substrate as shown in FIGS. 2-7.

According to the embodiment of the invention shown in FIGS. 2-7, instead of a simple lead frame formed of insulating material or of metal, a substrate or printed circuit board 30 including a thin flexible flat carrier 31 of insulating material, e.g. glass reinforced epoxy resin which is provided with a conductive layer or cladding on one side thereof is provided. The conductive layer or cladding of the substrate or printed circuit board 30 is then etched in a known manner to provide a plurality of conductor patterns 32 which are arranged in a row along the longitudinal length of the carrier 31 of the printed circuit board 30. As shown, each conductor pattern 32 comprises two spaced generally L-shaped conductors 33 and 34 which are essentially mirror images of one another. For example, approximately eight of such similar conductor patterns 32 may be formed along the length of the substrate or printed circuit board 30.

Thereafter, as shown in FIGS. 3 and 3a, the printed circuit board 30, and in particular the carrier 31 thereof, is punched or stamped to remove portions thereof to provide openings 36, 37 which define respective device mounting regions each including a central portion 38 completely which surrounds or includes a respective conductor pattern 32 and which is connected to the remainder of the carrier 31 only by a plurality of supporting arms 39 and 40 which are distributed about the periphery of the central portion 38. In this embodiment, the openings 36 and 37 are shaped such that each central portion 38 is connected by only two laterally extending supporting arms, i.e. the arms 39 and 40. However, it is to be understood that the openings may be differently shaped so as to provide more than two of the laterally extending supporting arms. Each respective central portion 38 has a diameter or outer dimension which is slightly greater than the coil which is to be mounted thereon so that each coil is disposed entirely on the respective mounting portion 38.

As shown in FIGS. 4 to 4c, the circuit components of each transponder or tag are then mounted on a respective central portion 38 of a respective device mounting region. In this embodiment, which essentially utilizes the same circuit components as in the previous embodiment, the integrated circuit 41 is directly mounted, for example by means of an adhesive, on the surface of the carrier 31 within the device mounting region 38 and between the two conductors of the respective conductor pattern 32, and the integrated circuit is connected to the respective leads 33 and 34 via respective wire bonds 42 as shown. The capacitor 43 is electrically connected via solder between the conductors 33 and 34 and the coil 44 is placed on the surface of the central portion 38 and has its ends 45 and 46 soldered to the conductors 33 and 34 respectively. The coil 44 may be fastened to the surface of the carrier 31 by means of an adhesive, and as shown surrounds the conductor pattern 32 with the connected integrated circuit 41 and the capacitor 43.

Figure 5:
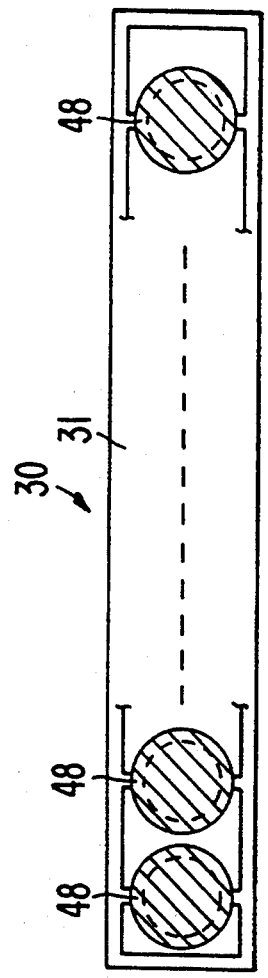
Figure 5A:
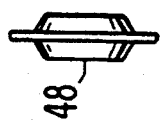
Figure 5B:
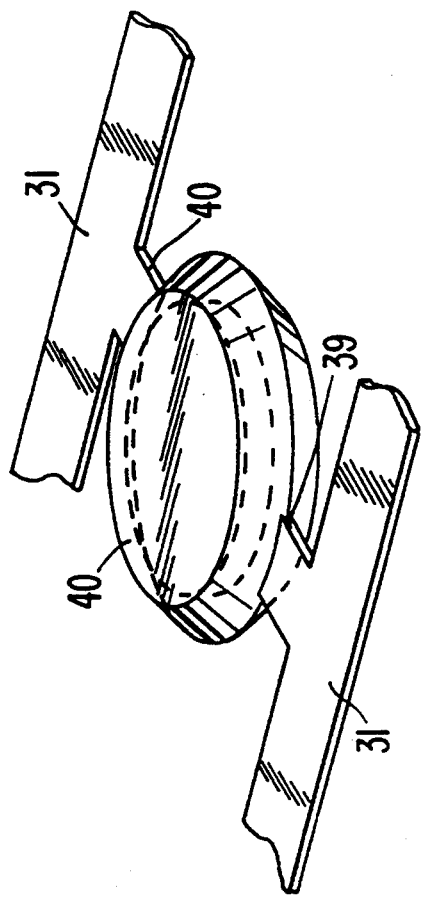
FIG. 5b is an enlarged view showing the encapsulated transponder while still attached to the printed circuit board of FIG. 5.
Figure 6:
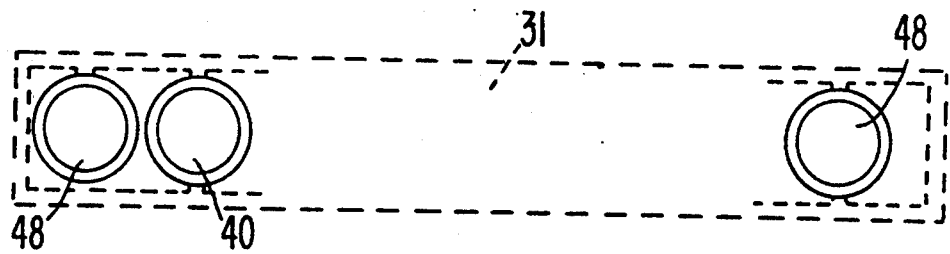
Figure 7:
FIG. 7 shows the transponder package resulting after the severing step in FIG. 6.

According to FIGS. 5-5b, the printed circuit board 30 with the attached components as shown in FIGS. 4-4c is then placed in a mold cavity wherein, by means of a conventional plastic molding process, each central portion 38 with its attached circuit components 41-44 is hermetically sealed in a respective housing 48 formed of a suitable plastic or epoxy. Each housing 48 completely encloses the associated central portion 38 of the respective device mounting region, and is attached to the remainder of the insulating carrier 31 only by the respective supporting arms 39 and 40. Thereafter, as shown in FIG. 6, the pairs of supporting arms 39 and 40 are severed at the periphery of the respective housings 48 to provide the finished housed device shown in FIG. 7.

Figure 8:
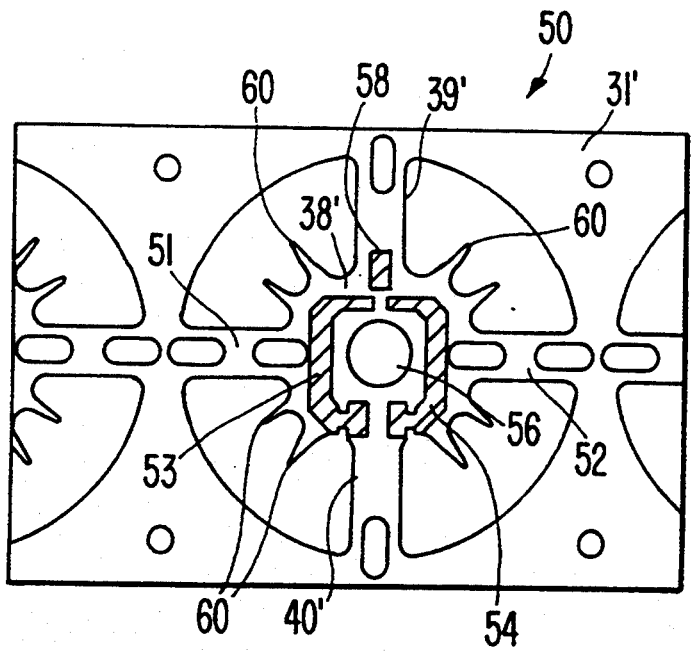
FIG. 8 is a plan view showing a preferred embodiment of a frame or substrate according to the invention utilized in a modification of the process according to FIGS. 2-6.
Figure 9:
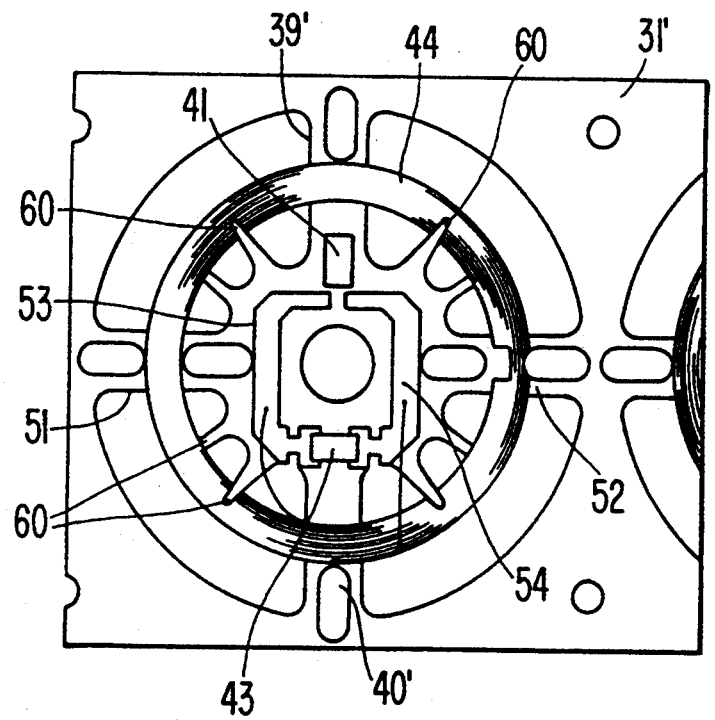
FIG. 9 is plan view showing the components of the transponder mounted on the frame or substrate of FIG. 8.

According to a preferred modification of the embodiment of FIGS. 2–7, a slightly differently configured printed circuit board 50 as shown in FIGS. 8 and 9 is substituted for the printed circuit board 30 so that the coil can be directly mechanically attached to the central portion of the device mounting region in a simple manner and without the need for any adhesives. As shown in FIGS. 8 and 9, each central portion 38' of a device mounting region is formed so that it has an outer dimension which is less than that of the coil for the circuit to be mounted thereon, and in this embodiment each portion 38' is connected to the remainder of the flat carrier 31' of insulating material not only by the pair of opposed supporting arms 39' and 40', but additionally by a further pair of opposed supporting arms 51 and 52 which are orthogonally arranged with respect to the arms 39', 40'. It should be noted, however, that it is possible, if desired, to utilize only three supporting arms symmetrically or asymmetrically disposed about the periphery of the central portion 38'. As shown, the central portion 38' is again provided with a separate conductor pattern including two adjacent conductors 53, 54 which are essentially mirror images of one another. Preferably, as shown, the central portion 38' is provided with an opening 56 in its center to facilitate the flow of a thermosetting epoxy compound during the transfer molding step. Additionally, the central portion 38' contains a further metalized region 58 adjacent, but spaced from the two conductors 53 and 54.

In order to enable attachment of a coil to the central portion 38' without the need for an adhesive or the like, the periphery of the central portion 38' is provided with a plurality of outwardly extending fingers or tabs 60 with at least one tab or finger 60 being provided between each two adjacent of the supporting arms, for example supporting arms 51 and 39' or 52 and 40', so that a minimum of four such fingers 60 are required for the illustrated arrangement of four supporting arms 39, 40', 51 and 52. Each of the fingers 60 is of a length which is greater than the inner diameter of the coil, so that it will be disposed beneath a coil symmetrically placed around the central portion 38'.

Figure 10:
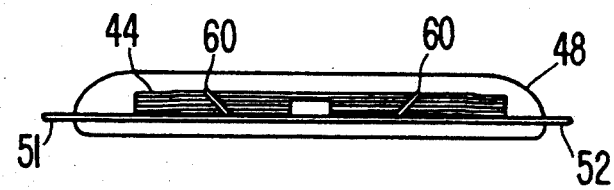
FIG. 10 is a schematic cross-sectional view of the transponder of FIG. 9 after encapsulation but prior to severing from the lead frame.

With the printed circuit board 50 of FIG. 8, the circuit components are mounted on the central portion 38' by connecting the capacitor 43 to the two leads 53 and 54, by attaching the integrated circuit to the conductive portion 58 via a non-conductive adhesive and electrically connecting the integrated circuit to the two leads 53 and 54 via two wire bonds, and by placing the coil 43 on the surface of the carrier 31' so that it symmetrically surrounds the central portion 38' with the remaining circuit components thereon. Thereafter, and in order to mechanically secure the coil 44 to the carrier 31 in its desired position, as shown in FIGS. 9 and 10, at least some of the fingers or projections 60 are bent upwardly through the center of the coil 44 so that they rest against the upper surface of the coil 44. As shown, substantially oppositely disposed pairs of fingers 60 are bent in this manner in order to provide offsetting forces. Moreover, although the preferred embodiment provides two fingers or projections 60 between each pair of adjacent supporting arms, only one such projection or finger need be provided and moreover only one (as shown) or both of each pair of adjacent fingers 60 need be bent so as to hold the respective coil 44. Thereafter, the ends of the coil 44 are electrically connected to the two leads 53 and 54 and the central portion 38' with the circuit components 41, 43, 44 mounted to form the housed drive 44. The final encapsulated device prior to severance from the carrier 39' and indicating the bent fingers or projections 60 is shown in FIG. 10.

The invention now being fully described, it will be apparent to one of ordinary skill in the art that any changes and modifications can be made thereto without departing from the spirit or scope of the invention as set forth herein.

What is claimed:

1. A method of forming a hermetically sealed radio frequency identification device comprising:
    providing a flat carrier having an opening and a plurality of inwardly directed supporting arms extending into the opening for supporting a radio frequency identification circuit including at least one coil for transmitting or receiving radio frequency energy, and an integrated circuit chip connected to the coil;
    mounting the circuit on the supporting arms such that the circuit including the coil is completely within the opening;
    forming a hermetically sealed plastic housing completely around the circuit and coil by transfer molding so that the housing is disposed within the opening and supported in the carrier only by the supporting arms; and
    severing the supporting arms at the periphery of the housing.

2. A method as defined in claim 1 wherein the carrier is formed of metal.

3. A method as defined in claim 2 wherein said step of mounting includes electrically connecting at least the coil and the circuit chip of the radio frequency circuit together via at least some of the supporting arms.

4. A method as defined in claim 1 wherein said carrier is formed of an insulating material.

5. A method as defined in claim 1 wherein said carrier includes a plurality of said openings arranged in a row and a respective plurality of the inwardly directed supporting arms extending into each opening.

6. A method as defined in claim 1 wherein the coil is a flat coil and said step of mounting includes positioning the coil and a circuit chip such that the coil rests on said supporting arms and the chip is disposed within the coil.

7. A method of forming an environmentally sealed radio frequency identification device comprising:
    providing a printed circuit board having a flat carrier of an insulating material and a plurality of respective conductor patterns arranged in a row on respective spaced device mounting regions of the carrier, with the carrier having openings such that each of the respective mounting regions includes a respective central portion which contains the respective conductor pattern and which is connected to the remainder of the carrier only by a respective plurality of supporting arms distributed about the periphery of the central portion;
    mounting a respective circuit chip for a radio frequency identification circuit and at least one coil for transmitting or receiving radio frequency energy on a respective said mounting region and connecting same via the respective conductor pattern to form a radio frequency identification circuit;
    forming a respective hermetically sealed plastic housing completely around the central portion of the respective mounting region and the associated radio frequency identification circuit by plastic molding so that the sealed housing is connected to the carrier only via the respective plurality of said supporting arms; and severing the supporting arms to remove the housed radio frequency identification circuit device from the carrier.

8. A method as defined in claim 7 wherein said step of providing a printed circuit board comprises:

providing a printed circuit board including a carrier of insulating material clad on one surface side with a conductive layer;

selectively etching the conductive layer to form said plurality of respective conductive patterns; and removing portions of the printed circuit board carrier to provide a plurality of said openings to form said plurality of mounting regions with the respectively associated plurality of supporting arms.

9. A method as defined in claim 8 wherein: the coil is a flat coil; and said step of removing includes forming the respective central portions of the mounting regions to be of a size less than an inner diameter of the coil; and said step of mounting includes positioning the coil so that it surrounds the associated central portion and so that the coil is engaged and supported on its one side facing the printed circuit board by the supporting arms.

10. A method as defined in claim 9 wherein: said step of removing additionally includes forming at least one outwardly directed projection on the periphery of the central portion of said mounting region between at least some of two adjacent supporting arms; and said step of mounting further includes bending at least some of the respective projections so that they extend through the associated coil and engage same on its side opposite said one side to physically secure the coil to the mounting region.

11. A method as defined in claim 8 wherein: the coil is a flat coil; and said step of removing includes forming the respective mounting regions to be of a size greater than an outer diameter of the associated coil; and said step of mounting includes placing the coil on the central portion so that it surrounds the respective conductor pattern and in turn is surrounded by said central portion.

12. A method as defined in claim 7 wherein each of said central portions of the mounting regions is provided with a pair of said supporting arms which are oppositely disposed.

13. A method as defined in claim 7 wherein each of said central portions of said mounting regions is provided with two orthogonal pairs of oppositely disposed supporting arms.

14. A method as defined in claim 7 wherein said supporting arms are symmetrically disposed about the periphery of the central portion of the mounting region.

15. A method as defined in claim 7 wherein said central portions of the mounting regions and said plastic housings are circular.

16. A non-metal lead frame for mounting of a circuit including at least a flat coil and an integrated circuit connected thereto; said lead frame comprising:

a printed circuit board having a flat carrier of an insulating material and a plurality of respective conductor patterns disposed on one surface of said carrier and arranged in a row on respective spaced circuit component mounting regions of the carrier;

a plurality of openings formed in said carrier such that each respective of said mounting regions includes a central portion which completely contains the respective said conductive pattern and which is connected to the remainder of the carrier only by a respective plurality of supporting lead-like portions of said carrier distributed about the periphery of said central portion.

17. A non-metal lead frame according to claim 16 wherein each of said central portions of the mounting regions is provided with a pair of oppositely disposed of the said lead-like portions.

18. A non-metal lead frame according to claim 16 wherein each of said central mounting regions is provided with two orthogonal pairs of oppositely disposed supporting lead-like portions.

19. A non-metal lead frame according to claim 16 wherein said supporting lead-like portions are symmetrically disposed about the periphery of the central portion of the mounting region.

20. A non-metal lead frame according to claim 19 wherein: each of said central portions is of a size smaller than an inner diameter of the coil to be mounted thereon; and said mounting region further includes at least one outwardly directed finger projecting from the periphery of the respective central portion between each two adjacent of said supporting lead-like portions, with said fingers being of a length such that they can extend through a coil placed on a surface of said carrier to mechanically secure the coil on the mounting region.

21. A non-metal lead frame according to claim 20 wherein said fingers are symmetrically disposed about the periphery of said central portion.

* * * * *